United States Patent [19]

Crookshanks

[11] Patent Number: 4,747,095
[45] Date of Patent: May 24, 1988

[54] SAW DEMODULATOR EMPLOYING CORRECTIVE FEEDBACK TIMING

[75] Inventor: Rex J. Crookshanks, Palos Verdes Estates, Calif.

[73] Assignee: Hughes Aircraft Company, Los Angeles, Calif.

[21] Appl. No.: 881,300

[22] Filed: Jul. 2, 1986

[51] Int. Cl.$^4$ .............................................. H04J 4/00
[52] U.S. Cl. ......................................... 370/70; 370/50
[58] Field of Search .................................. 370/50, 70

[56] References Cited

U.S. PATENT DOCUMENTS

| | | | |
|---|---|---|---|
| 3,328,528 | 6/1967 | Darlington | 370/70 |
| 3,560,654 | 2/1971 | Darlington | 370/70 |
| 4,304,000 | 12/1981 | Bonnerot et al. | 370/50 |
| 4,590,595 | 5/1986 | Morimura | 370/50 |

Primary Examiner—Douglas W. Olms
Assistant Examiner—Min Jung
Attorney, Agent, or Firm—S. M. Mitchell; M. J. Meltzer; A. W. Karambelas

[57] ABSTRACT

An analog surface acoustic wave demodulator includes a calibration section (10) for compensating for distortions, a calibrated frequency sweep (20), a pair of dispersion sections formed by reflective array compressors (24, 26 and 36, 38), a synchronizer (18, 22, 28, 118), a timing signal generator (42) and a temperature compensating readout circuit (40). Frequency domain compensations introduced at the signal input by the calibration section and by the frequency sweep compensate for distortions in time domain at the output of the demodulator. The calibration function applied to the input signal and to the sweep is stored in ROM's (14, 44) in the form of complex digital words. Timing and address generators (12, 42) read the words from the Rom's to complex multipliers (16, 52) such that each symbol period is multiplied by the sequence of words. Each complex digital word corresponds to an amplitude and phase modulation on the incoming signal over a fraction of a symbol period. The synchronizer fires the frequency sweep section at the proper time to eliminate intersymbol interference. The temperature compensating readout circuit locks on to synchronizing signals generated by the synchronizer and provides a time base which is used to readout of the demodulated signals. The synchronizing signals are employed to generate a feedback error signal which is used by the timing signal generator to generate timing signals for firing the frequency sweep section and for selecting the proper calibration function to be applied to each sweep.

19 Claims, 5 Drawing Sheets

SAW DEMODULATOR EMPLOYING CORRECTIVE FEEDBACK TIMING

BACKGROUND OF THE INVENTION

The present invention broadly relates to frequency sweeps, spectrum analyzers and demodulators, and deals more particularly with a surface acoustic wave demodulator employing corrective feedback that compensates for the nonlinear effects on signal processing which are caused by analog devices employed to effect frequency dispersion.

Analysis of signals in the frequency domain is widely used in communications systems as well as to obtain physical and electrical system performance information. For example, manufacturers of mechanical structures, such as aircraft and bridges, may perform spectrum analysis of a signal produced by a motion-to-electrical signal transducer to permit monitoring of vibration components associated with imbalance and worn bearings and gears, as well as to identify the natural mode of vibration of a mechanical system.

Spectrum analyzers are also used in electronic testing to assess nonlinear effects of amplification, mixing and filtering, to determine the purity of signals, measurement of radio frequency power, frequency and modulation characteristics, and to provide amplitude analysis for electrical networks. In telecommunication systems, transceivers and multiplex systems are assessed with respect to their spectrum, modulation, wave and audio characteristics.

A spectrum analyzer or sweep generator may be employed as a compressive receiver for determining the spectral components of a radio frequency (rf) signal. A communications system, for example, may incorporate such a spectrum analyzer as a demodulator for transforming a frequency division multiplexed (FDM) signal to a time division multiplexed (TDM) signal. Spectrum analysis can be performed digitally by so called "Fast Fourier Transformers" (FFT's) which provide a Fourier transformation of the incoming signal. For some applications, however the computational power requirements for these devices for a desired input bandwidth are impractical. This is particularly true in satellite communications where system power and weight are severely limited. Additionally, the digital processing introduces undesirable delays in the signal, due substantially to the analog-to-digital conversion process which is employed by these devices. Additionally, the bandwidth of some of these devices is limited by the system clock rate.

Analog spectrum analyzers offer the prospect of real time transformations without great demands on processing power. Previous analog spectrum analyzers employed as demodulators have been provided which include a pair of frequency × delay dispersion sections with an intervening frequency sweep section. The first dispersion section introduces delays as a function of frequency to an incoming signal, such as a FDM signal. The frequency sweep signal converts the frequency components of the dispersed FDM signal into a series of sweeps. The second dispersion section collapses each sweep into a pulse so that the series of sweeps becomes a TDM signal.

Previous analog spectrum analyzers either employ filter banks or sweep filters. Filter banks are rather bulky and sweep filters are unsuitable for some applications such as demodulators where it is necessary to sample each frequency continuously. The dispersion sections in demodulators of the type described above include devices generically classified as dispersive filters. These filters are also known as surface acoustic wave (SAW) dispersive or linear frequency modulator chirp filters. The first such devices were based on interdigital electrotransducers (IDT's). The IDT consists of a set of interleafed metal electrodes deposited on a surface of a set of piezoelectric substrate, normally quartz. However, IDT based spectrum analyzers have not provided the time-bandwidth product sufficient for some satellite communication applications.

More recently, devices with greater time-bandwidth products have been provided using reflective array compressors (RAC's). The RAC can be manufactured by etching into a crytalline substrate, e.g. lithium nibate, a multitude of slits, e.g. 1000, each tuned to reflect a given frequency. By reflecting different frequencies at different slits, and thus different locations, differential delays are introduced into a through-going signal as a function of frequencies.

The use of RAC's and other similar analog devices in previous types of demodulators introduce error into the processed signal, which in turn limits the effective bandwidth of the receiver. In some cases, the nonlinearities result in phase errors and distorted pulse development. These nonlinear effects are further exacerbated by changes in temperature which alter the operating characteristics of the analog components.

SUMMARY OF THE INVENTION

In accordance with the present invention, a spectrum analyzer in the form of a demodulator provides corrective feedback which compensates for distortions introduced by dispersion filters, including those resulting from changes in temperature. The demodulator includes two dispersion sections and an intermediate frequency sweep section. A calibration section processes a through-going signal according to a function corresponding to the distortions introduced by one or more of the dispersion sections.

In the illustrated embodiment, the demodulator converts FDM signals to TDM signals. The calibration section preprocesses the incoming signal, prior to the introduction of delays by the first dispersion section, by multiplying it by a calibration function. The calibration function can be in the form of a series of complex digital words permitting amplitude and phase variations in the incoming signal. The complex digital words can include a sign bit in order that gains as well as attenuations can be introduced, and also in order that the power level of the output can be adjusted to that of the input.

The affect of distortions introduced by the first dispersion section is negligible compared to those introduced by the second dispersion section, consequently, the calibration function can be determined by a network analysis of the circuit from the frequency sweep section through the second dispersion section. The results of the network analysis are subtracted from expected ideal values to determine the compensation required in accordance with an algorithm.

The intermediate frequency sweep section compensates for distortions introduced by analog components of the sweep at an intermediate point in the dispersion process. The sweep section includes a pulse modulator which provides pulse inputs to the sweep with a period between pulses which is less than the desired differential delay in individual sweeps so as to produce overlapping sweeps. The sweep section includes a pair of RAC's which successively apply differential delays to the pulse which is equal to or less than the period of the pulse source. A complex multiplier applies precise and individual calibration functions to each sweep, thereby compensating for distortions introduced by the RAC's which form a part of the frequency sweep section.

The frequency sweep output is synchonized with the incoming signal and is combined in a mixer which each set of staggered symbol segments output by the first dispersion section.

The second dispersion section is nominally identical to the first dispersion section and functions to collapse each sweep into a pulse corresponding to an FSK channel.

A synchronizer is provided to fire or pulse the frequency sweep section at the proper time in order to eliminate the possibility of intersymbol interference. The synchronizer includes a modulator for introducing a pair of tracking frequencies into the through-going signal as well as means for introducing a pair of marker frequencies into the signal. The marker frequencies are introduced into the through-going signal at two precise frequency locations respectively at the top and bottom of the frequency band. The marker frequencies are spaced at one of twice the orthogonal spacing positions from the FSK data, where the orthogonal spacing is determined by the output bandwidth of the second dispersion section.

A temperature compensating readout circuit locks on to the marker frequencies and provides a time base which allows accurate readout of the tracking frequencies as well as the demodulated FSK signals. After being read out, the tracking frequencies are employed to develop a feedback error signal. The error signal is utilized by a timing generator which produces timing signals for firing the frequency sweep section and for selecting the proper calibration function to be applied to each sweep.

The demodulated FSK data is converted to digital form and is stored in a split phase memory until it can be read out at the system timing rate of the incorporating communications system. The present demodulator is thus compatible with digital processing systems.

In a preferred form of the invention, the synchronizer generates the signals for firing the frequency sweep section using a single pair of timing signals rather than respective pairs of marker and tracking frequencies. The timing signals are injected into the through-going signal as dither modulated tones, thereby reducing the amount of demodulator bandwidth required to accommodate timing signals and thus increasing the bandwidth available for communication purposes.

DESCRIPTION OF THE PREFERRED EMBODIMENTS

Figure 1:
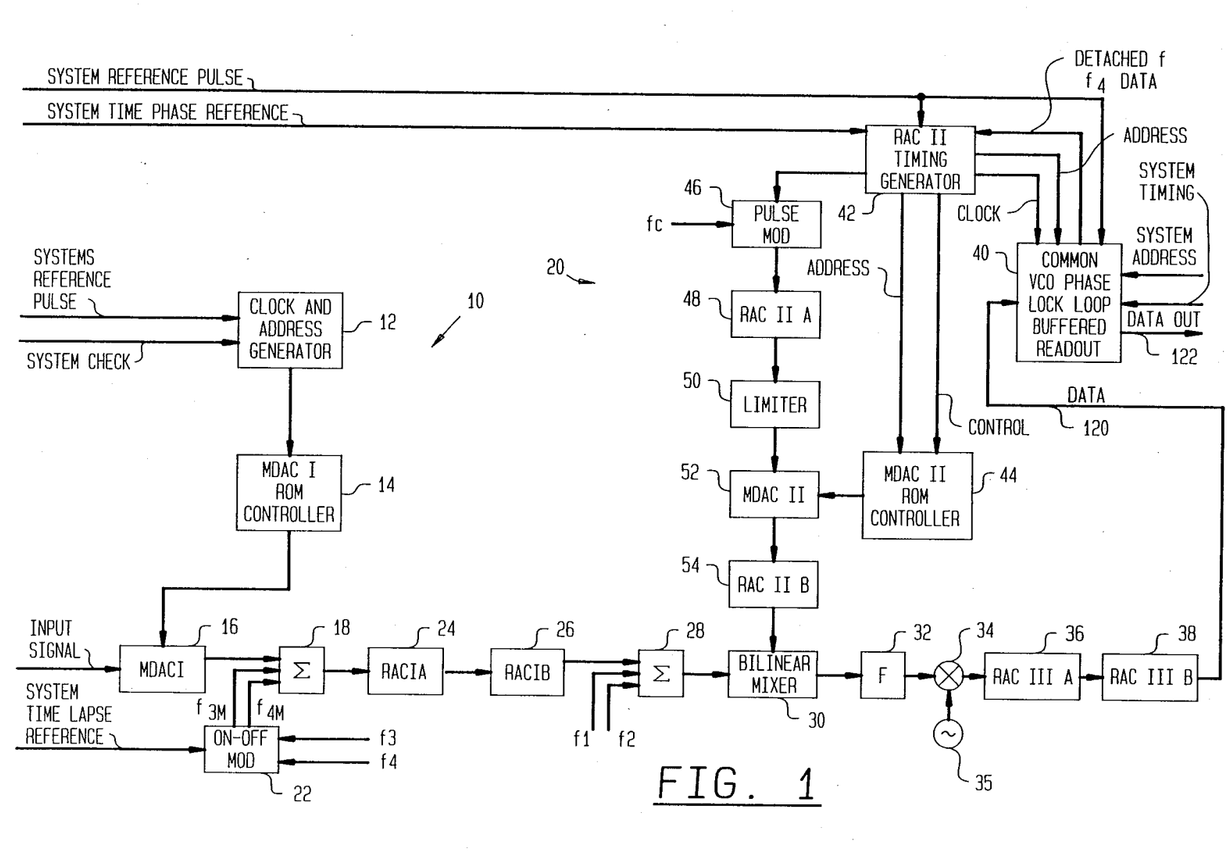
FIG. 1 is a block diagram of a SAW demodulator employing corrective feedback timing in accordance with the present invention.

Reference is first made to FIG. 1 wherein a spectrum analyzer in the form of a demodulator is depicted, which includes first and second frequency delay dispersion sections respectively defined by corresponding pairs of RAC's 24, 26 and 36, 38. The RAC's in each pair thereof 24, 26 and 36, 38 are in series with each other and each provides one half of the total desired time dispersion delay over the full bandwidth of the input signal, with the result that two RAC's in series yield the full desired time dispersion delay over the full bandwidth.

The demodulator further includes a calibration section 10, a frequency sweep 20, a bilinear mixer 30 and a temperature compensating buffered readout 40 and a timing signal generator 42.

The demodulator functions to convert an input in the form of FDM signals to "data out" in the form of TDM signals. The calibration section 10 functions to compensate for distortions introduced by the components of the demodulator and particularly the second dispersion section consisting of RAC's 36, 38.

The calibration section 10 includes a complex multiplier 16 for multiplying the incoming signal by a calibration function in the form of a series of complex digital words. The calibration function is stored in a ROM (read only memory) 14. The calibration function data is read out from memory 14 and delivered to the multiplier 16 in response to address signals produced by an address generator 12 which is driven by system reference pulses and system check signals.

The demodulator depicted in FIG. 1 is normally itself a component of an incorporating communications system that assists in synchronizing the action of the address generator 12 and the timing generator 42 which controls the frequency sweep section 20 with the onset of symbol periods of the incoming signal.

In the embodiment illustrated herein, the incoming FDM signals are more specifically characterized as multiplexed frequency shift keyed (MFSK) signals within a predetermined frequency range, e.g. the 50 MHz range from 200 mHz to 300 mHz. Within this range are included a multitude, e.g. 1000, narrow band channels, each assignable to a frequency shift keyed (FSK) signal.

Each FSK channel represents a stream of binary data at a predetermined common baud rate. All channels switch from one bit or symbol to the next simultaneously. For example, if the baud rate is 10 kHz, each symbol has a duration of 100 microseconds. The output of the spectrum analyzer is a series of 100 microsecond segments, each comprising 1000 "pulse windows" spaced 100 nanoseconds apart. The pulse spacings may be decreased to provide slack between TDM segments, in order to permit the inclusion of timing information within the pulse train.

In response to cues from the incorporating communications system, the timing generator 42, which is controlled by a later discussed synchronizer, fires a pulse modulator 46 once every symbol, e.g. every 100 microseconds. The pulse modulator 46 modulates a carrier frequency $f_c$ in accordance with the timing signals received from the timing generator 42. Each pulse includes a spectrum of frequency components over the desired sweep range, which is twice the frequency range of the incoming signal.

In addition to the pulse modulator 46, the frequency sweep 20 includes a first RAC 48, a complex multiplier 52 and a second RAC 54. The RAC's 48 and 54 are analog signal dispersers which introduce differential delays in signals conveyed therethrough; these delays are monotonic functions of frequency. The RAC's 48 and 54 are designed to cooperate to produce the desired sweep form. In the illustrated system, the desired form is a linear sweep, which is effected by designing both RAC's 48, 54 with nominally linear dispersion patterns.

The first RAC 48 disperses the pulses according to a linear, or other monotonic, function of frequency. The differences between the maximum delay and the minimum delay introduced is equal to, or slightly less than, the period of the pulse modulator 46. This dispersion is not so great as to create overlapping of successive pulses.

The complex multiplier 52 is a signal processor which serves to post-modulate the rough sweep output of the first RAC 48 and pre-modulate the input of the second RAC 54 to compensate for distortions (non-linearities) introduced by the RAC's, thereby to attain the desired sweep form. The frequency sweep 26 converts each pulse into a linear sweep with a maximum differential delay of twice the symbol period.

The complex multiplier 52 introduces a time varying transfer function to the dispersed pulse and comprises a radio frequency multiplying digital-to-analog converter (MDAC). More specifically, the complex multiplier 52 multiplies the analog signal with a succession of complex digital words, each including a sign bit. This allows modification of the amplitude and phase of the incoming signal as function of time.

The succession of digital words is stored in a ROM (read only memory) 44 and is introduced word-by-word in response to control and address signals provided by the timing generator 42. The timing generator 42 fires the pulse modulator 46 in a manner which synchronizes the pulses and succession of digital words. In effect, the timing generator 42 steps the ROM 44 through the succession of digital words which are respectively multiplied against segments of the rough sweep. For example, the rough sweep can be divided into, for example, 128 adjacent and equal time segments, each of these segments being multiplied by a predetermined digital word.

The function or succession of digital words, stored in the ROM 44 is selected to compensate for the peculiarities in the specific RAC's 48 and 54. The function is calculated from measurements by a network analyzer (not shown) which measures the phase information between the input of the first RAC 48 and the output of the second RAC 54. The method of calculating the ROM function will be discussed later.

The complex multiplier 52 can more precisely tune a sweep which is already close to the desired frequency sweep. Consequently, the RAC's 48 and 54 are designed to provide linear frequency sweeps. Furthermore, in order to achieve a constant amplitude, approximately linear frequency sweep, a limiter 50 is inserted between the first RAC 48 and the complex multiplier 52, which functions to equalize the amplitudes as a function of frequency of the multiplier inputs.

Figure 3:
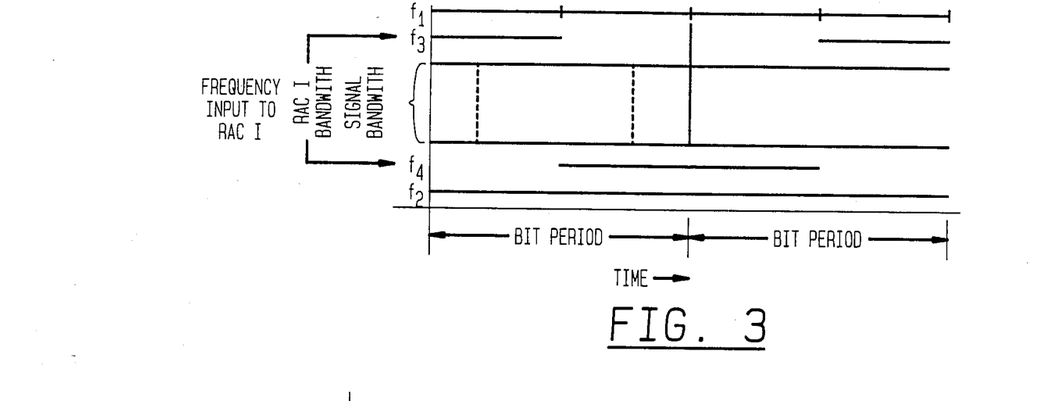
FIG. 3 is a time-frequency waveform chart showing the input FDM signal in relationship to the marker and tracking frequencies.

The incoming signal to the spectrum analyzer is received by the complex multiplier 16 which forms a portion of the calibration section 10. This input signal comprises a multiplicity, e.g. 1000 synchronized FSK signals, each with an assigned channel frequency within the signal bandwidth indicated in FIG. 3. The FSK signals are appropriately modified by the calibration section 10 and are then delivered to a summer 18 where they are combined with a pair of pulse tracking frequencies $f_3$ and $f_4$. The tracking frequencies $f_3$ and $f_4$ are modulated by a modulator 22 in accordance with a system time lapse reference signal. As shown in FIG. 3, tracking frequencies $f_3$ and $f_4$ are respectively immediately above and below the signal bandwidth of the FSK signals and define the bandwidth of the first analog dispersion section which comprises RAC's 24 and 26.

The RAC's 24 and 26 function to introduce differential delays as a function of frequency into the incoming signal. The same purpose could be served by a sequence of RAC's or other dispersion filters, such as IDT's.

The delay introduced at the low end of the incoming signal's frequency range is one symbol period longer than the delay introduced into the high end of the frequency range. The RAC's 24 and 26 are nominally linear so that the delays introduced at intermediate frequencies are readily determined by interpolation.

The segments of the incoming signal are staggered by the RAC's 14, 26 and these staggered components are combined at a summer 28 with a pair of marker freqencies $f_1$ and $f_2$. As shown in FIG. 3, marker frequency $f_1$ is at the top of the frequency band and outside the pass band of RAC's 24 and 26, while marker frequency $f_2$ is at the bottom of the frequency and outside of the pass band of RAC's 24 and 26.

The staggered components of the incoming FSK signals, along with the marker frequencies $f_1$, $f_2$ and tracking frequencies $f_3$ and $f_4$ are mixed with the output of the frequency sweep 20 at a bilinear mixer 30. The modulator 22, summers 18, 28 and a later discussed phase lock loop function as a synchronizer which assures that the timing generator 42 fires the frequency sweep section 20 at the proper time, thereby eliminating the possibility of intersymbol interference. Thus, the frequency sweep section 20 is synchronized with the incoming FSK signals such that each frequency sweep sweeps an entire set of staggered segments. A post mixer filter 32 eliminates the sum term from the mixing, so that only the difference term of the product progresses through the system.

A local oscillator 35 generates a translation signal $f_s$ for centering the frequency range of the series of sweeps on the center frequency of the pass band of the second analog frequency dispersion section which comprises RAC's 36 and 38. The translation signal $f_s$ is mixed with the series of sweeps at a second mixer 34.

Figure 4:
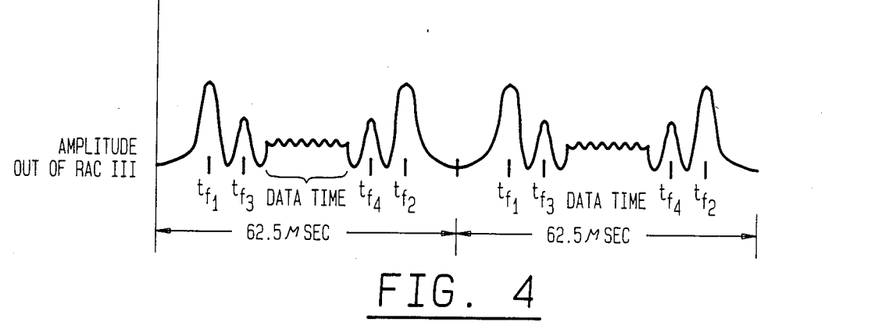
FIG. 4 is a time-amplitude waveform chart showing the output of the second dispersion section.

RAC's 36 and 38 are nominally identical to RAC's 24 and 26. In other words, RAC's 36, 38 introduce differentials as a monotonic function of frequency into the through-going signal. The effect of RAC's 36, 38 is to "stand up" or collapse each sweep into a pulse. As shown in FIG. 4, the output of the RAC's 36, 38 is a series of pulses, each pulse corresponding to a sweep and hence to one of the original FSK channels. The tracking frequencies $f_3$, $f_4$ are defined by a pair of pulses respectively on opposite sides of the data pulses and having amplitudes greater than the data pulses. Similarly, the marker frequencies $f_1$ and $f_2$ are defined by pulses respectively outside the tracking frequency pulses $f_3$, $f_4$ and possess amplitudes greater than these latter pulses.

As previously mentioned, the affects of imperfections in the RAC's 24, 26 and 36, 38 can result in amplitude and phase deviations from the nominal monotonic, e.g. linear delay×frequency function of the RAC. Phase distortions introduced by the RAC's 24, 26 result in relative timing shifts of the individual channels. In other words, a particular segment of a given channel could be advanced or retarded relative to its nominally expected position. Where the segment is advanced, the corresponding sweep includes more low frequency and less high frequency content than expected. Likewise, where a segment is retarded, the corresponding sweep includes more high frequency and less low frequency content than expected.

However, within the anticipated range of distortions, all the components within the pass band of RAC's 36, 38 are present at their respective inputs and arrive at the proper time. Thus, errors introduced by the RAC's 24, 26 are, for the most part, eliminated by the filtering action of the second set of RAC's 36, 38 and have negligible impact on the output of the demodulator.

Amplitude distortions introduced by the RAC's 24, 26 result in constant relative attenuation differentials between channels. However, there is essentially no impact on amplitude differentials between successive symbols within a channel. These errors can be corrected in the readout 40 which will be later discussed.

Distortions introduced by the RAC's 36, 38 can contribute significantly to intersymbol interference, and thus impair the performance of a demodulator. Phase distortions introduced by RAC's 36, 38 result in the misalignment of the frequency components of the pulse outputs. In other words, the durational centers of the frequency components of a given component will occur at slightly different times. This results in symbol spreading which in turn contributes to intersymbol interference. Furthermore, pulse height is reduced thereby impairing the signal-to-noise ratio of the system.

Amplitude distortions affect the frequency distribution of the pulses. Since certain frequency distributions permit better differentiation of successive pulses, amplitude distortion also contributes to intersymbol interference.

The character of the demodulator is such that the frequency-varying time deviations at its output can be precompensated by introducing complementary time-varying frequency deviations at its input. Furthermore, time-varying amplitude control over the input permits control over output pulse shapes so that intersymbol interference can be minimized.

The premodulation can be applied by multiplying the incoming signal by a complex time-varying function. Since the function is complex, both phase and amplitude can be modified. In the illustrated embodiment, as previously mentioned, the complex multiplier 16 is employed to multiply the incoming analog signal by a series of complex digital words, including a sign bit. Thus, the calibration function is represented in the ROM 14 by a series of complex digital words, numbering, for example, 128. These words are applied seriatum in response to signals supplied by the address generator 12. The series of digital words, or the calibration function in whatever form it may take, is tailored to the specific RAC's 36, 38.

In a similar manner, as discussed above, a calibration function stored in a ROM 44 is employed by the complex multiplier 52 to correct for changes in the amplitude and phase of the frequency sweep resulting from RAC's 48 and 54. The function stored in ROM 44 results in the proper sequence of amplitude and phase modulating terms being applied to the sweep signal by the complex multiplier 52, thereby resulting in a constant amplitude and linear time varying frequency output from RAC 54. The frequency sweep is adjusted to be identical to the time delay characteristic of RAC's 36, 38.

The calibration functions stored in the ROM 44 may be calculated by the following procedure. The characteristics of RAC's 36, 38 are first measured on a network analyzer (not shown) following which the phase information is analyzed to obtain the quadratic phase term's constant. The complex multiplier 52 is held at constant amplitude and phase shift, and the network analyzer is employed to measure the transfer characteristic from the input of RAC 48 to the output of RAC 54. The phase is now expanded in a set of Legendre Polynomials. The constant and linear term and the quadratic term from RAC's 36, 38 are subtracted from the raw phase data. Next, the amplitude and this modified phase data are expanded in a complex Legendre series of which only the first ten terms are used. Then, the correction coefficients are calculated by forming the factor:

$$\frac{K_{oc}P_o(f,t)}{K_{oc}P_o(f,t) + K_{1c}P_1(f,t) + K_{2c}P_2(f,t) \ldots K_{10c}P_{10}(f,t)}$$

The proper time base in which the above correction factor is used can be determined by measuring the linear and quadratic phase term of RAC 48 and the limiter 50 and rationing these values against the linear and quadratic phase term of the assembly starting at the input to RAC 48 and the output of RAC 54. This time base can be matched to the addresses of the timing generator 42. Consequently, when the pulse modulator 46 is pulsed and the timing generator is operated at the same time, it may be appreciated that a constant amplitude and the desired linear frequency verses time spectrum is output from RAC 54.

In a similar manner, a calibration function is generated for storage in the ROM 14 for use by the calibration section 10.

If all the RAC's have the same slope and no amplitude or phase distortion, and if the pulse modulator 46 is triggered at the proper time with a sufficiently narrow pulse, then the input signals to the demodulator appear at the output of RAC 38 as bandlimited pulses spaced apart from each other in time so that each of these bandlimited impulses can be read separately. Once adequate impulses are formed at the output of RAC 38, it is necessary to read the peak values of each of these impulses and transfer this data to the incorporating communication system at the system clock rate.

Figure 2:
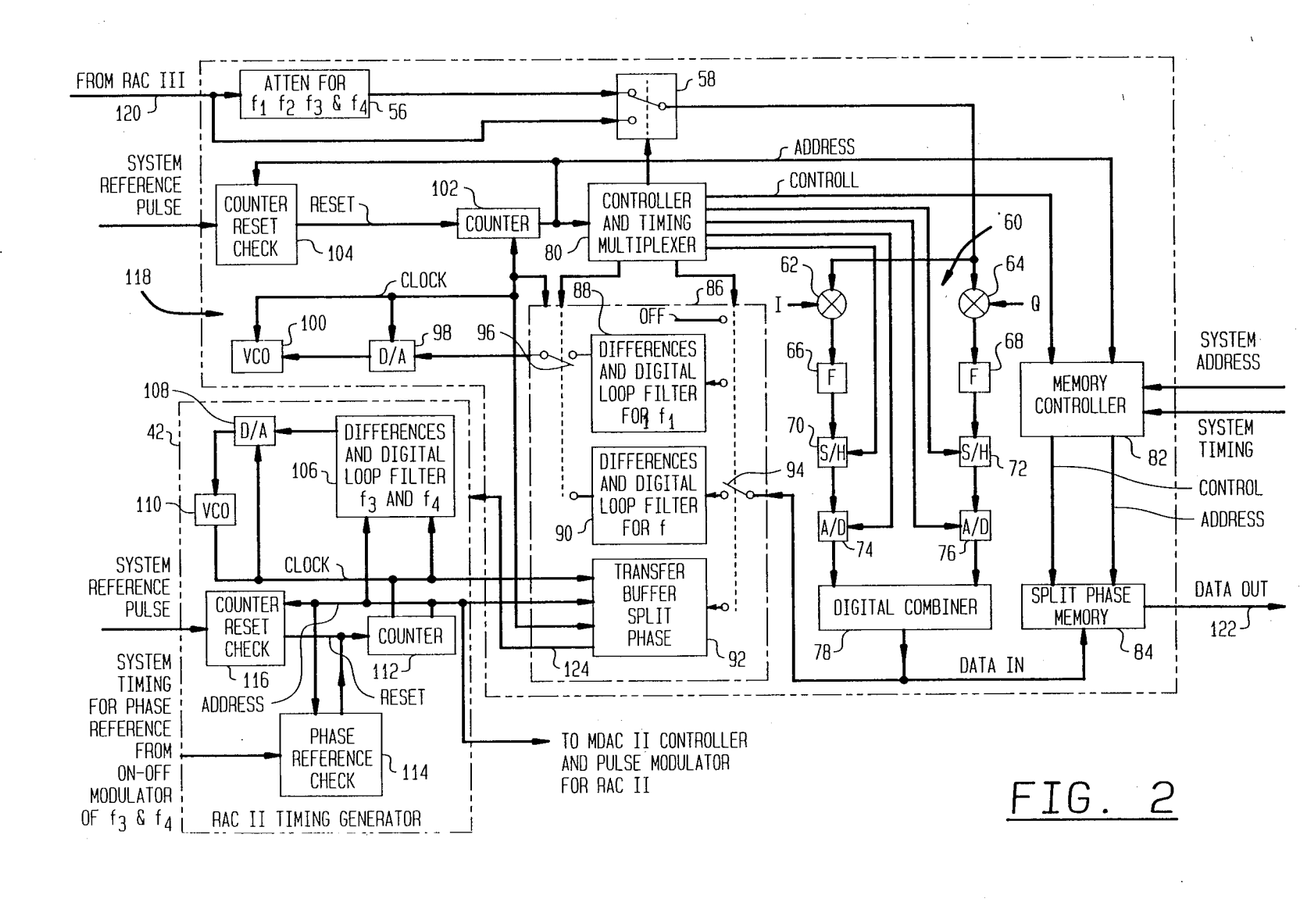
FIG. 2 is a block diagram of the temperature compensating readout circuit and timing generator employed in the SAW demodulator shown in FIG. 1.

Referring now also to FIG. 2, the temperature compensating buffered readout 40 receives the data output from RAC 38 on a data input line 120 and outputs this data at the system clock rate on a data output line 122. The readout 40 functions to readout, at the proper time, the amplitude of the resulting data pulses on line 120 and then store this information in a split phase memory 84 until the data can be readout at the system clock rate for subsequent use in system calculations.

In order to accomplish the foregoing, the marker frequencies $f_1$ and $f_2$ are introduced into the throughgoing signal by the summer 28 (FIG. 1) at two precise frequency locations respectively at the top and bottom of the frequency band and outside of the pass band of RAC's 24 and 26 (FIG. 1). As previously discussed, the spacing of these two frequencies $f_1$ and $f_2$ is at one of the twice orthogonal spacing positions from the data.

The readout 40 broadly includes an attenuator 56, a digitally controlled switch 58, a convertor circuit 60, a digital controller 80 and a phase lock loop generally indicated by the numeral 118. The incoming signals on line 120 are delivered through the attenuator 56 which is activated by the $f_1$, $f_2$, $f_3$ and $f_4$ signals in order to reduce these signals to the same range as the signal level expected during the data time (FIG. 4). Attenuation of these signals reduces the dynamic range requirement of later discussed analog-to-digital (A/D) convertors 74, 76.

The switch 58 is operated by the controller 80 and functions to selectively switch the attenuator 56 into the circuit immediately before and after the data time so as to only attenuate the $f_1$, $f_2$, $f_3$ and $f_4$ signals.

The incoming signal is delivered to the convertor 60 which includes an I, Q translate 62, 64 that translates the pulses to a frequency close to base band. The in-phase and quadra-phase components of the signals are then respectively passed through filters 66, 68 which filter out the upper sideband. A pair of sample and hold units 70, 72 hold the filtered signal, typically for 0.1 of the time of the orthogonal spacing, thereby providing a constant signal level for use in A/D convertors 74, 76 which convert the analog signal into an eight bit digital word. The digitized signal output from the convertor 60 is then processed by a digital combiner 78 which performs a square root of the sum of the squares function on the digital I, Q signals (words), thereby forming the amplitude of the envelope of the signal at the sample time. The sample time is determined by the controller 80 which in turn receives timing signals from a counter 102 forming a portion of the phase lock loop 118.

The data output by the digital combiner consisting of the data pulses as well as the marker and tracking frequencies, is delivered to a split phase memory 84, as well as to the signal input of a digital processing circuit generally indicated within the broken line 86.

Data is read into the split phase memory 84 at a clock rate determined by the phase lock loop 118, but is read out of the memory 84 on line 122 at the "system" clock rate of the incorporating communications system. Data readout from the split phase memory 84 is determined by control and address signals generated by a memory controller 82. The memory controller 82 receives address and timing signals from the incorporating communications system, and also receives internal control signals from the controller 80 and address signals generated by the counter 102.

Figure 7:
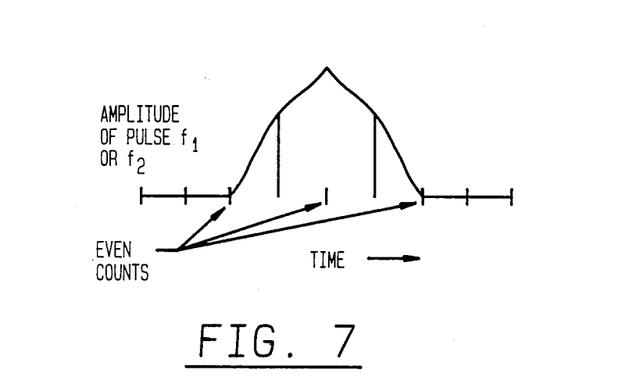
FIG. 7 is a time-amplitude waveform chart showing the relationship of the readout of data and the timing pulses.

The counter 102 may be clocked at either the orthogonal timing rate or at one half of that rate, i.e. at twice the orthogonal timing rate, however, the clocking rate can be changed to either phase of a VCO (voltage controlled oscillator) 100 which produces the clocking pulses. As shown in FIG. 7, if the counter 102 is clocked at the orthogonal timing rate, then data is read from the split phase memory 84 on the even counts and the marker pulses ($f_1$ and $f_2$) are sampled by the processor 86 on the odd counts. It may be appreciated that this same result can be obtained by changing the phase of the VCO 100 at $f_1$ and $f_2$ read times or by changing the window of time about the time that $f_1$ and $f_2$ are expected.

The VCO 100 is time shared between a pair of differences and digital loop filters 88 and 90 respectively associated with the marker frequencies $f_1$ and $f_2$, which form a portion of the digital processor circuit 86. The output of the digital combiner 78 is selectively delivered to either one of the filters 88, 90 or a split phase transfer buffer 92 via a switch 94 which is operated by control signals produced by the controller 80. Similarly, a switch 96 operated by the controller 80 selectively connects the output of one of the filters 88, 90 with the input of a D/A convertor 98 which drives the VCO 100.

The phase lock loop 118 is aligned by resetting the counter 102 using a reset clock counter 104 controlled by reference pulses derived from the incorporating communications system.

The marker frequency signals $f_1$ and $f_2$ are employed to generate a tracking discriminate. The tracking discriminate is produced by providing a window of K counts before the $f_1$ or $f_2$ pulse is expected and K counts after it is expected. All values of envelope occurring K counts before the expected arrival of the pulse may be added to the count and all values occurring after the expected arrival are subtracted from the count. This procedure provides a discriminate 2K counts wide to servo the VCO 100.

In order to insure that the desired pulse falls at some point within the window discriminate, a second window is set up by the counter 102 which is 2M counts wide where M is less than K. The purpose of this window is to assure that a system prediction pulse falls asynchronously at some point within the 2M window; if it does, then the counter 102 is not reset. However, if the system pulse does not fall within the window, at any one window event time, then the next time that the system pulse occurs, it resets the counter 102 to coinside with what zero M count and zero K count would be according to the prediction pulses. Thus, the next time the desired pulses $f_1$ and $f_2$ are in the discriminate window and within the window of the reset check counter 104, the VCO 100 will servo the counter 102 to straddle the pulse. The above reset procedure is performed only for the $f_1$ pulse since the range of the VCO 100 can be selected so as to insure that the $f_2$ pulse will fall within the discriminate window.

Figure 5A:
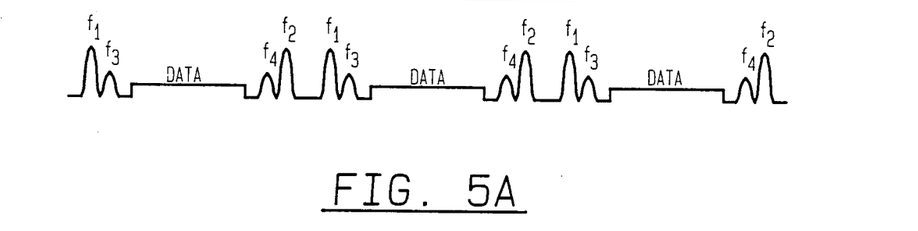
FIGS. 5A and 5B depict time-amplitude waveform charts of the two segments of the signal to be tracked.
Figure 5B:
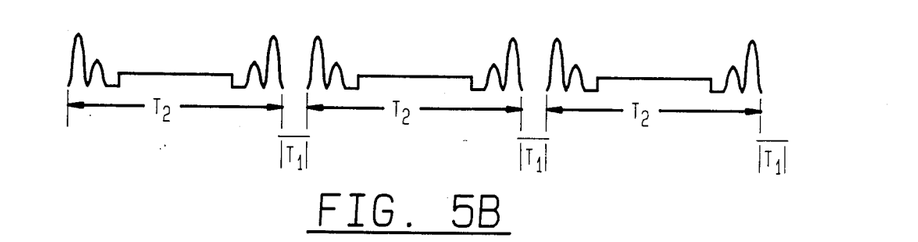

As previously indicated, the VCO 100 receives information from the filters 88, 90 on a time sharing basis. An understanding of this time sharing relationship may best be obtained by referring now to the waveform diagrams shown in FIGS. 5A and 5B. From FIG. 5B, it is apparent that $T_1 + T_2$ is the total cycle time of the demodulator. Additionally, it may be observed that there is no reason to expect or assume that either $T_1$ or $T_2$ form a commensurate period with respect to $T_1+T_2$, i.e., there is no reason to believe that:

$$\frac{T_2}{M_2} = \frac{T_1}{M_1},$$

where $M_1+M_2$ is the total count of the counter 102.

Figure 6:
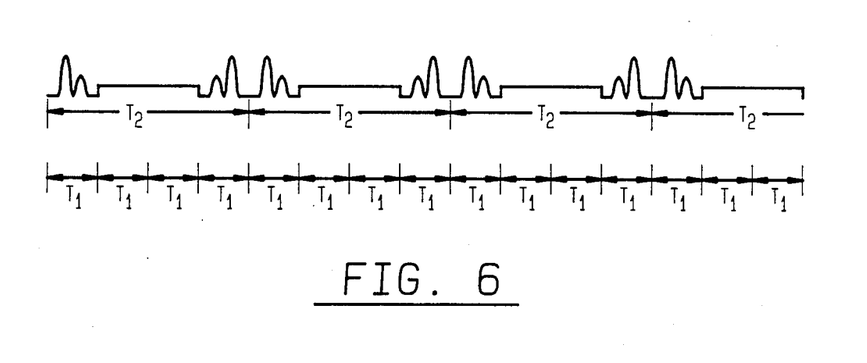
FIG. 6 is a time-amplitude waveform chart showing the effective timing intervals for each symbol period.

Accordingly, it is apparent that it is necessary for the VCO 100 to operate at different respective frequencies during the $T_1$ and $T_2$ time periods. Therefore, loop filter 88 controls the VCO 100 during time period $T_1$ and loop filter 90 controls the VCO 100 during time period $T_2$. In effect, with respect to the control of the VCO 100 by filters 88 and 90, the ends of successive $T_2$ time periods are joined together and the ends of successive $T_1$ time periods are likewise joined together to form two signals having totally independent, different time intervals. The end to end relationship of the time periods $T_1$ and $T_2$ respectively associated with the marker frequencies $f_1$ and $f_2$ are shoown in FIG. 6. Thus, from the foregoing, it may be appreciated that the two loops have commensurate counts over their time period and the VCO 100 therefore stabilizes to a constant value.

Discriminates for each of the loops mentioned above are formed in the following manner. First, the $f_2$ pulse forms a discriminate for the $T_2$ loop which centers on the $f_2$ pulse. Next, the discriminate for the $T_1$ is formed from the $f_1$ pulse during the $T_2$ clocking interval. The error signal in the $f_1$ discriminate servos the time period $T_1$ such that the $f_1$ pulse is centered in its corresponding discriminate. If the number of counts of the counter 102 equals the number of orthogonal spacing or twice orthogonal spacing between the $f_1$ pulse and the $f_2$ pulse, then these counts are centered on any and all twice orthogonal pulses occurring during the data time as well as the tracking pulses $f_3$ and $f_4$.

Since both the $T_1$ loop and the $T_2$ loop receive error signals only once during each cycle time of the demodulator, then the integrators which form a portion of the filters 88, 90 must perform an integration only between error samples. Consequently, the integration can be carried out uniformly over the time that the VCO 100 is connected to one of the loop filters 88, 90. Alternatively, the integration can be carried out continuously and in the preferred method, the integration is performed immediately after the error signal has been detected in each cycle. This latter mentioned method is preferred because it holds the VCO 100 constant over the entire read time of the $T_2$ period, thus facilitating integration in a single clock cycle.

Stability of the $T_1$ and $T_2$ loops is assured by selecting the $T_1$ loop bandwidth such that it is an order of magnitude wider than the $T_2$ loop bandwidth. With this difference in bandwidths, it may be appreciated that when there exists an error in both the $T_1$ and the $T_2$ loop, the $T_1$ loop locks onto the $f_1$ pulse first, and then the $T_2$ loop draws into lock on the $f_2$ pulse more slowly with the $T_1$ continuously tracking the $f_1$ pulse. Hence, the order of magnitude difference in the loop bandwidths between the $T_1$ loop and the $T_2$ loop tend to decouple the two loops.

The timing generator 42 includes a phase lock loop formed by a differences and digital loop filter 106, a D/A convertor 108 and a VCO 110. The timing generator 42 also includes a counter 112 which drives the phase lock loop, along with a reset check counter 116 and a phase reference checker 114. The counter 112 outputs a count which is employed by the memory controller 82 to address the split phase transfer buffer 92, as well as to address the ROM 44 (FIG. 1). The output of counter 112 is also employed to fire the pulse modulator 46. The phase lock loop of the timing generator 42 receives its error signals from the digital processor 86, as data read from the split phase transfer buffer on line 124. The discriminate that produces this error signal is generated by forming the discriminate over two cycle times of the demodulator from the tracking pulses $f_3$ and $f_4$. From FIG. 4, it may be seen that the discriminate is formed by:

$$\left(\begin{array}{cc} f_3 \text{ pulse} & - f_4 \text{ pulse} \\ \text{even} & \text{even} \end{array}\right) - \left(\begin{array}{cc} f_3 \text{ pulse} & - f_4 \text{ pulse} \\ \text{odd} & \text{odd} \end{array}\right) \text{or}$$

$$\left(\begin{array}{cc} f_3 \text{ pulse} & - f_3 \text{ pulse} \\ \text{even} & \text{odd} \end{array}\right) + \left(\begin{array}{cc} f_4 \text{ pulse} & - f_4 \text{ pulse} \\ \text{odd} & \text{even} \end{array}\right),$$

where even and odd refer to the counts of the counter 112.

Since the amplitude of the $f_3$ and $f_4$ pulses are read by the readout 40, the loop bandwidth of the phase lock loop of the timing generator 42 should be an order of magnitude smaller than the loop bandwidth of the $T_1$ of the phase lock loop 118 due to the fact that these are coupled phase lock loops.

The counter 112 sets up timing windows when a pulse is expected to be received from the system timing, in order to establish the expected time of commencement of the pulse which is delivered to the pulse modulator 46. If the system timing pulse is not received during this window time, then the next time the system pulse does in fact arrive, it actuates the reset check counter 116 which in turn resets the counter 112 to the center of the window and causes the pulse modulator 46 to fire. Counter 112 is not reset by the system pulse so long as the system pulse arrives during the window time. The phase information of the modulation on the tracking frequencies $f_3$ and $f_4$ results in a similar reset relative to the even and odd counts.

Figure 8:
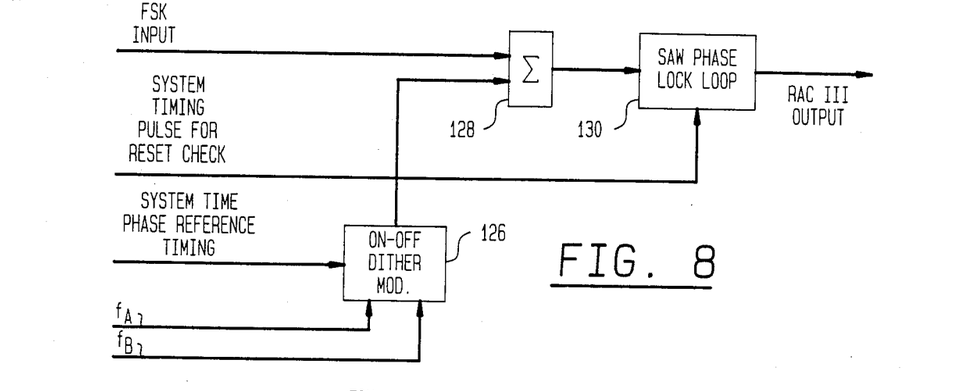
FIG. 8 is a block diagram of an arrangement for injecting a single pair of dither modulated timing tones into the through-going signal.

Reference is now made to FIG. 8 which depicts an alternate form of the synchronizer in which a single pair of dither modulated tones are injected into the throughgoing signal. The synchronizer includes a dither modulator 126, a summer 128 and a phase lock loop 130. The synchronizer depicted in FIG. 8 is intended to be employed in lieu of that previously described with respect to FIGS. 1 and 2, and is advantageous in that only a single pair of synchronization signals $f_A$, $f_B$ are required in contrast to the two pairs of synchronization tones or signals ($f_1$, $f_2$, $f_3$, $f_4$) employed in the previously described synchronizer. The use of a single pair of synchronization signals results in the dedication of a smaller fraction of the SAW demodulator bandwidth for use in generating synchronization signals, thereby providing more bandwidth which can be used for communication purposes.

The system time phase reference signal is modulated in an on-off manner by the modulator 126 using the synchronization tones $f_A$, $f_B$. The synchronization tones $f_A$, $f_B$ output by the modulator 126 are combined with the FSK input signals by the summer 128. The summed output from summer 128 drives a phase lock loop 130 which functions in a manner similar to the phase lock loop 118 (FIG. 2) previously described. The output of the phase lock loop 130 is employed to generate an error signal which drives the timing generator 42 (FIGS. 1 and 2).

Figure 9:
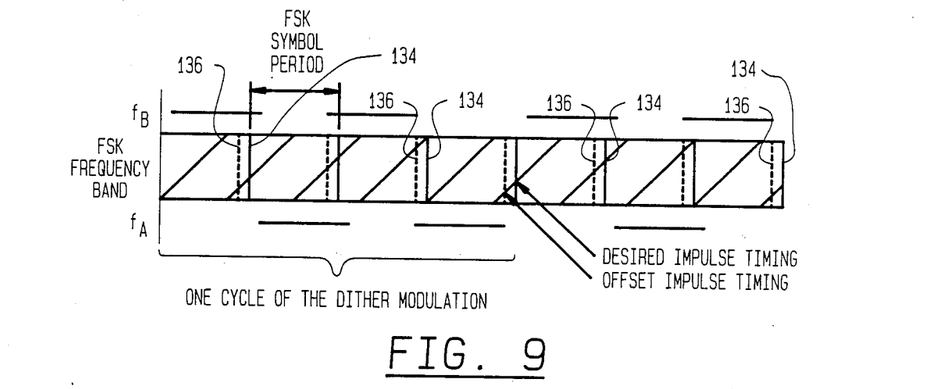
FIG. 9 is a time-frequency waveform chart showing the relationship between the injected, dither modulated tones and the FSK frequency band.

FIG. 9 depicts the signal output from summer 128 and shows the relationship between the dither modulated injected tones $f_A$, $f_B$ and the band of frequencies occupied by the FSK signal. The solid vertical lines 134 in FIG. 9 indicate the boundary between successive FSk signals, which is the desired location of the timing signals delivered to the timing generator 42 referred back to the input timing. The broken vertical lines 136 indicate the impulse timing which is offset from the desired location.

Figure 10:
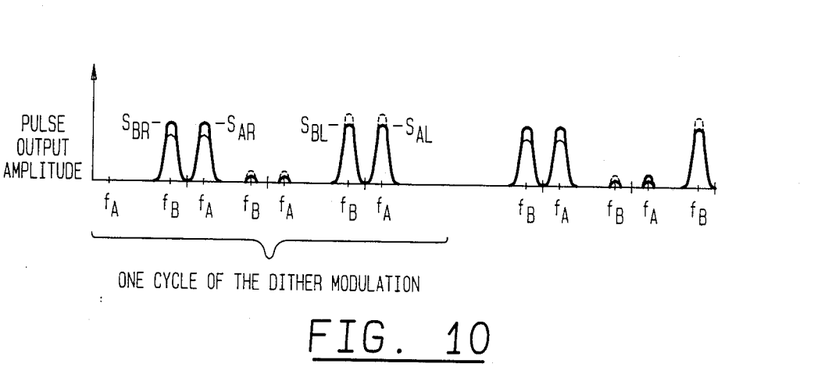
FIG. 10 is a time-amplitude waveform chart showing the pulses output from the second dispersion section, using the dither modulation arrangement depicted in FIG. 10.

FIG. 10 depicts the envelopes of the pulses output from the second dispersion section (i.e. line 120 in FIG. 1) resulting from the dither modulated injected tones $f_A$, $f_B$, wherein the solid wave form lines indicate the pulses obtained from correct impulse timing and the broken wave form lines indicate the pulses obtained from the offset impulse timing.

Using the amplitudes of the pulses shown in FIG. 10, i.e. $S_{AR}$, $S_{BR}$, $S_{AL}$, $S_{BL}$, a discriminate $S_E$ is formed which is defined by:

$$S_E = S_{AR} + S_{BR} + S_{BL} - S_{AL}$$

In the case of correct pulse timing, the amplitudes of these four pulses are equal, consequently $S_E$ equals zero. However, in the case of offset pulse timing, $S_{AR}$ equals $S_{BR}$ and $S_{AL}$ equals $S_{BL}$, but $S_{AR}$ and $S_{BR}$ are greater than $S_{AL}$ and $S_{BL}$, since $S_{AR}$ and $S_{BR}$ are present with the sweep of the frequency sweep section 20 for a greater period of time than are $S_{AL}$ and $S_{BL}$; consequently, $S_E$ is greater than zero. Similarly, if the impulse timing is offset in the opposite direction, $S_{AR}$ equals $S_{BR}$, $S_{AL}$ equals $S_{BL}$, but $S_{AR}$ and $S_{BR}$ are less than $S_{AL}$ and $S_{BL}$; consequently, $S_E$ is less than zero.

Thus, $S_E$ is a discriminate employed by the phase lock loop 130 for synchronizing the operation of the timing generator 42 to the FSK signal. Since the dithered tones $f_A$, $f_B$ are present during virtually the entire symbol, the response of RAC's 36, 38 (FIG. 1) to these signals is narrower than that described in the previously described embodiment which employs four synchronizing tones. In other words, the pulses output from the second dispersion section as a result of the injection of the dither modulated tones $f_A$, $f_B$ are relatively narrow compared to the pulses generated through the use of the tracking frequencies $f_3$, $f_4$ employed in the embodiment depicted in FIGS. 1 and 2. In fact, the pulses output from the second dispersion section are similar to the pulses generated by the marker frequencies $f_1$, $f_2$, except that they are slightly amplitude modulated and occur at only one half the previous frequency. In any event, the dither modulating arrangement shown in FIG. 8 may be satisfactorily employed in combination with the temperature compensating readout circuit shown in FIG. 2, thereby reducing the overall complexity of the SAW demodulator while increasing the bandwidth available in the demodulator for communication purposes.

From the foregoing, it is apparent that the SAW demodulator employing corrective feedback timing as described above substantially reduces the possibility of intersymbol interference due to amplitude or phase variations introduced by the dispersion sections caused by changes in temperature and the like. Moreover, the data may be readout from the demodulator at the clock rate of the incorporating communications system and is therefore compatible with digital processing systems. It is recognized that those skilled in the art may make various modifications or additions to the preferred embodiment chosen to illustrate the invention without departing from the spirit and scope of the present contribution to the art. For example, while a demodulator has been choosen herein to illustrate one particular embodiment of the invention, the invention can also be implemented in a sweep generator or spectrum analyzer. Accordingly, it is to be understood that the protection sought and to be afforded hereby should be deemed to extend to the subject matter claimed and all equivalents thereof fairly within the scope of the invention.

What is claimed is:

1. A spectrum analyzer for converting frequency division multiplexed signals to time division multiplexed signals, comprising:
   means for receiving a frequency division multiplexed signal having plural frequency bands each conveying a signal with successive symbol segments;
   first analog dispersion means for introducing differential delays in said frequency division multiplexed signal as a first nominal monotonic delay function of frequency, said first analog dispersion means being characterized by a first actual delay function of frequency so as to stagger signal segments which are concurrently received by said receiving means;
   a frequency sweep section including means for generating a predetermined frequency sweep and means for multiplying the staggered signal segments by said predetermined frequency sweep so as to produce a series of frequency sweep signals;
   second analog dispersion means for introducing differential delays as a second nominal monotonic delay function of frequency, said second nominal function being selected so as to collapse into a pulse a frequency sweep signal which is calculated to result from a signal input processed according to said first nominal function and said predetermined frequency sweep, and second analog dispersion means being characterized by a second actual delay function of frequency;
   means coupled with said frequency sweep action for compensating for deviations in said second actual delay function from said second nominal monotonic delay function; and,
   means coupled with said frequency sweep section and with said second analog dispersion means for synchronizing the generation of said predetermined frequency sweep with the time occurrence of said symbol segments, whereby to prevent intersymbol interference.

2. The spectrum analyzer of claim 1, including a calibration section for compensating for deviations in said first and second actual delay functions from said first and second nominal delay functions, whereby the output of said second analog dispersion means is substantially that calculated for a system in which said actual delay functions are equal to said nominal delay functions.

3. The spectrum analyzer of claim 2, wherein:
   said first and second analog dispersion means each includes a reflective acoustic coupler device; and,
   said calibration section includes an output coupled with said receiving means for outputting a compensating calibration function, said compensating calibration function being applied to said frequency division multiplexed signal before differential delays are introduced in said frequency division multiplexed signal by said first analog dispersion means.

4. The device of claim 1, wherein said synchronizing means includes:
   means for injecting first and second reference signals into said frequency division multiplexed signal, said first and second reference signal respectively having frequencies above and below the bandwidth of said frequency division multiplexed signal;
   means coupled with said second analog dispersion means for sensing the amplitude of pulses output by said second analog dispersion means, including means for detecting said first and second reference signals; and,
   means responsive to said detecting means for generating timing signals for controlling said frequency sweep section.

5. The spectrum analyzer of claim 4, wherein said pulse amplitude sensing means includes:
   means for converting said first and second reference signals into first and second sets of pulses;
   means for converting said first and second sets of pulses into digital data;
   a phase lock loop having an error signal input for receiving digital data from said converting means corresponding to said first and second sets of pulses.

6. The spectrum analyzer of claim 5, wherein said pulse amplitude sensing means further includes:
   means for selectively connecting said pulse converting means with said error signal input to alternately drive said phase lock loop with digital data corresponding to said first and second sets of pulses respectively; and,
   a counter driven by said phase lock loop for outputting control signals.

7. The spectrum analyzer of claim 6, including a memory connected with said pulse converting means for receiving and storing digital data corresponding to the time division multiplexed signal and means controlled by control signals output from said counter for controlling readout of digital data stored in said memory.

8. The spectrum analyzer of claim 1, wherein said synchronizing means includes means for introducing first and second pairs of reference signals into said frequency division multiplexed signal, each of said first and second pairs of reference signals being associated with a symbol segment, said spectrum analyzer further including:
   a readout circuit for receiving said pulses and said first and second pairs of reference signals and for reading out said reference signals, said readout circuit including means for generating a time base using said first pair of reference signals; and,
   a timing generator responsive to said second pair of reference signals for generating timing signals for controlling the generation of frequency sweeps by said frequency sweep section.

9. The spectrum analyzer of claim 8, wherein said readout circuit includes:
   means for converting said pulses and said first and second pairs of reference signals into digital data;
   memory means coupled with said pulse converting means for storing the digital data corresponding to said pulses; and,
   control means coupled with said memory for reading digital data from said memory means in accordance with said time base.

10. The spectrum analyzer of claim 9, wherein said readout circuit includes:
    a phase lock loop having an error input, and having a clock output for providing clock signals to said control means; and,
    a digital processing circuit for selectively delivering digital data corresponding to said first pair of reference signals from said pulse converting means to said error input.

11. The spectrum analyzer of claim 8, wherein said timing generator includes:
    a phase lock loop having an error signal input for receiving said second pair of reference signals from said readout circuit, and having a clock signal output; and,
    a counter for receiving clock signals from said clock signal output and for outputting a count corresponding to said timing signals.

12. For use in a digital communications system having a digital system time base, a demodulator for converting frequency division multiplexed signals to time division multiplexed signals, comprising:
    means for receiving a frequency division multiplexed signal having plural frequency bands each conveying a signal with successive symbol segements;
    analog dispersion means for introducing differential delays in said frequency division multiplexed signal as a monotonic delay function of frequency so as to stagger the signals concurrently received by said receiving means;
    means for generating a predetermined frequency sweep;
    means for mixing the symbol segments with said predetermined frequency sweep so as to produce a series of frequency sweep signals;
    means for receiving and converting said frequency sweep signals into respective pulses defining a time division multiplexed signal; and,
    means for reading out the respective pulses defining said time division multiplexed signal from said converting means at the rate of said digital system time base, said readout means including
    (1) means for introducing first and second reference signals into said frequency division multiplexed signal, said first and second reference signals respectively having frequencies above and below the bandwidth of said frequency division multiplexed signal,
    (2) means connected with said frequency sweep signal converting means for converting pulses into digital data,
    (3) means connected with said pulse converting means for storing digital data, and
    (4) means coupled with said pulse converting means for receiving digital data corresponding to said reference signals and for generating timing control signals for reading out digital data from said storing means to said communications system at the time base rate of said system.

13. A device for converting frequency division multiplexed signals to time division multiplexed signals, comprising:

means for receiving a frequency division multiplexed signal having plural frequency bands each conveying a signal with successive symbol segments;

analog dispersion means for introducing differential delays in said frequency division multiplexed signal as a monotonic delay function of frequency so as to stagger the signals concurrently received by said receiving means;

means for generating a predetermined frequency sweep;

means for mixing the symbol segments with said predetermined frequency sweep so as to produce a series of frequency sweep signals;

means for converting the frequency sweep signals into respective pulses defining a time division multiplexed signal; and, means for synchronizing the generation of said predetermined frequency sweep by said generating means with the time occurrence of said symbol segments, whereby to prevent interference between successive ones of said signals, said synchronizing means including (1) means for injecting first and second reference signals into said frequency division multiplexed signal, said first and second reference signals respectively having frequencies above and below the bandwidth of said frequency division multiplexed signal, said injecting means including means for dither modulating a system reference signal with said first and second reference signals to produce a modulated signal, and means for combining said modulated signal with said frequency division multiplexed signal, (2) means connected with said converting means for receiving and detecting said first and second reference signals, and (3) means responsive to said detecting means for generating timing signals, said frequency sweep generating means being controlled by said timing signals.

14. A device for converting frequency division multiplexed signals to time division multiplexed signals, comprising:

means for receiving a frequency division multiplexed signal having plural frequency bands each conveying a signal with successive symbol segments;

analog dispersion means for introducing differential delays in said frequency division multiplexed signal as a monotonic delay function of frequency so as to stagger the signals concurrently received by said receiving means;

means for generating a predetermined frequency sweep;

means for mixing the symbol segments with said predetermined frequency sweep so as to produce a series of frequency sweep signals;

means for converting the frequency sweep signals into respective pulses defining a time division multiplexed signal; and, means for synchronizing the generation of said predetermined frequency sweep by said generating means with the time occurrence of said symbol segments, whereby to prevent interference between successive ones of said signals, said synchronizing means including (1) means for injecting first and second reference signals into said frequency division multiplexed signal, said first and second reference signals respectively having frequencies above and below the bandwidth of said frequency division multiplexed signal, said injecting means including means for dither modulating a system reference signal with said first and second reference signals to produce a modulated signal, and means for combining said modulated signal with said frequency division multiplexed signal, (2) means connected with said converting means for receiving and detecting said first and second reference signals, and (3) means responsive to said detecting means for generating timing signals, said frequency sweep generating means being controlled by said timing signals, said receiving and detecting means including (1) means for converting said first and second reference signals into first and second sets of pulses, (2) a phase lock loop having an error signal input, (3) means for selectively connecting said converting means with said error signal input to alternately drive said phase lock loop with said first and second sets of pulses respectively, and (4) a counter driven by said phase lock loop for outputting control signals for controlling the output of said time division multiplexed signals from said device.

15. A device for converting frequency division multiplexed signals to time division multiplexed signals, comprising:

means for receiving a frequency division multiplexed signal having plural frequency bands each conveying a signal with successive symbol segments;

analog dispersion means for introducing differential delays in said frequency division multiplexed signal as a monotonic delay function of frequency so as to stagger the signals concurrently received by said receiving means;

means for generating a predetermined frequency sweep;

means for mixing the symbol segments with said predetermined frequency sweep so as to produce a series of frequency sweep signals;

means for converting the frequency sweep signals into respective pulses defining a time division multiplexed signal; and, means for synchronizing the generation of said predetermined frequency sweep by said generating means with the time occurrence of said symbol segments, whereby to prevent interference between successive ones of said signals, said synchronizing means including means for introducing first and second reference signals into said frequency division multiplexed signal, each of said first and second reference signals being associated with a symbol segment;

a readout circuit for receiving said pulses and said first and second pairs of reference signals and for reading out said reference signals, said readout circuit including means for generating a time base using said first paid of reference signals; and a timing generator responsive to said second pair of reference signals for generating timing signals for controlling the generation of frequency sweeps by said frequency sweep generating means.

16. The device of claim 15, wherein said readout circuit includes:

means for converting said pulses and said first and second pairs of reference signals into digital data;

memory means coupled with said pulse converting means for storing the digital data corresponding to said pulses; and, control means coupled with said memory means for reading digital data from said memory means in accordance with said time base.

17. The device of claim 16, wherein said readout circuit includes:
   a phase lock loop having an error input, and having a clock output for providing clock signals to said control means; and
   a digital processing circuit for selectively delivering digital data corresponding to said first pair of reference signals from said pulse converting means to said error input.

18. The device of claim 15, wherein said timing generator includes:
   a phase lock loop having an error signal input for receiving said second pair of reference signals from said readout circuit, and having a clock signal output; and
   a counter for receiving clock signals from said clock signal output and for outputting a count corresponding to said timing signals.

19. A device for converting frequency division multiplexed signals to time division multiplexed signals, comprising:
   means for receiving a frequency division multiplexed signal having plural frequency bands each conveying a signal with successive symbol segments;
   analog dispersion means for introducing differential delays in said frequency division multiplexed signal as a monotonic delay function of frequency so as to stagger the signals concurrently received by said receiving means;
   means for generating a predetermined frequency sweep;
   means for mixing the symbol segments with said predetermined frequency sweep so as to produce a series of frequency sweep signals;
   means for converting the frequency sweep signals into respective pulses defining a time division mutliplexed signal;
   means for synchronizing the generation of said predetermined frequency sweep by said generating means with the time occurrence of said symbol segments, whereby to prevent interference between successive ones of said signals; and,
   a calibration section coupled with said receiving means for compensating for deviations in said monotonic delay function of frequency from an ideal delay function, whereby the respective pulses output by said frequency sweep converting means are substantially those calculated for a system in which the actual monotonic delay function of frequency is equal to said ideal delay function.

* * * * *